(12) United States Patent
Du et al.

(10) Patent No.: US 6,248,394 B1
(45) Date of Patent: Jun. 19, 2001

(54) PROCESS FOR FABRICATING DEVICE COMPRISING LEAD ZIRCONATE TITANATE

(75) Inventors: Honghua Du; John Edwin Graebner, both of Short Hills; Sungho Jin, Millington; David Wilfred Johnson, Jr., Bedminster; Wei Zhu, Warren, all of NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/235,735

(22) Filed: Jan. 22, 1999

Related U.S. Application Data
(60) Provisional application No. 60/096,581, filed on Aug. 14, 1998.

(51) Int. Cl.[7] ....................................................... B05D 3/00
(52) U.S. Cl. ................... 427/100; 427/596; 427/255.32; 427/561
(58) Field of Search ............................ 427/255.32, 561, 427/596; 204/192.18, 192.2, 192.22

(56) References Cited

U.S. PATENT DOCUMENTS

| | | | |
|---|---|---|---|
| 5,198,269 | * 3/1993 | Swartz et al. | 427/226 |
| 5,358,889 | 10/1994 | Emesh et al. | |
| 5,514,484 | * 5/1996 | Nashimoto | 428/700 |
| 5,589,284 | 12/1996 | Summerfelt et al. | |

(List continued on next page.)

OTHER PUBLICATIONS

C. K. Kwok et al "Low Temperature Perovskite Formation of Lead Zirconate Titanate Thin Films by a Seeding Process", *J. Mater. Res.*, vol. 8, No. 2, p. 339, 1993.*

A. S. Nickels et al, "Laser Ablation–Deposited PZT Thin Films for Piezoelectric Microsensors and Microactuators", *Integrated Ferroelectrics*, vol. 10, p. 89, 1995.*

B. Jaber et al, "Characterization of Ferroelectric and Piexoelectric Properties of Lead Titanate Thin Films Deposited on Si by Sputtering", *Sensors and Actuators A*, vol. 63, p. 91, 1997.*

K. Higaki et al., "High Frequency Saw Filter On Diamond", *IEEE MTT–S Digest*, vol. 6, 829 (1997).

S. Shikata et al., "High Frequency bandpass filter using polycrystalline diamond", *Diamond and Related Materials*, vol. 2, 1197 (1993).

Y. Shibata et al., "Epitaxial Growth of $LiNbO_3$ Films on Sapphire Substrates by Excimer Laser Ablation Method and Their Surface Acoustic Wave Properties", *Jpn. J. Appl. Phys.*, vol. 32, L745 (1993).

T. Shiosaki et al., "High–Coupling and High–Velocity SAW Using ZnO and AIN Films on a GLass Substrate", *IEEE Transactions on Ultrasonics, Ferroelectrics, and Frequency Control*, vol. UFFC–33, No. 3, (1986).

(List continued on next page.)

Primary Examiner—Shrive Beck
Assistant Examiner—Paul D. Strain
(74) Attorney, Agent, or Firm—Scott J. Rittman

(57) ABSTRACT

The invention provides a device comprising an oriented, perovskite PZT layer on a diamond substrate, or other substrates such as silicon or platinum-coated materials. Vapor phase deposition processes are used to deposit a PZT layer onto a perovskite template layer on the substrate. The template layer is more readily deposited in a perovskite structure compared to PZT, and provides for nucleation and growth of the deposited PZT in perovskite form. The vapor phase deposition promotes the oriented structure of the resulting film. The structure is useful in a variety of devices, including surface acoustic wave devices.

8 Claims, 7 Drawing Sheets

U.S. PATENT DOCUMENTS

| | | | | |
|---|---|---|---|---|
| 5,626,906 | * | 5/1997 | Summerfelt et al. | 427/126.3 |
| 5,674,563 | * | 10/1997 | Tarui et al. | 427/250 |
| 5,714,194 | * | 2/1998 | Komai et al. | 427/81 |
| 5,719,417 | | 2/1998 | Roeder et al. | |
| 5,912,068 | * | 6/1999 | Jia | 427/376.2 |

OTHER PUBLICATIONS

A.S. Nickels et al., "Laser Ablation–Deposited PZT Thin Films For Piezoelectric Microsensors and Microactuators", *Integrated Ferroelectrics*, vol. 10, 89 (1995).

B. Jaber et al., "Characterization of ferroelectric and piezoelectric properties of lead titanate thin films deposited on Si by sputtering", *Sensors and Actuators A*, vol. 63, 91 (1997).

R. Dat et al., "Lead Zirconate Titanate Ferroelectric Capacitors Produced On Sapphire And Gallium Arsenide Substrates", *Integrated Ferroelectrics*, vol. 9, 309 (1995).

C.K. Kwok et al. "Low temperature perovskite formation of lead zirconate titanate thin films by a seeding process", *J. Mater. Res.*, vol. 8, No. 2, 339 (1993).

A. Masuda et al., "Preparation and crystallographic characterizations of highly oriented $Pb(Zr_{0.52}Ti_{0.48})O_3$ films and MgO buffer layers on (100) GaAs and (100) Si by pulsed laser ablation", J. Crystal Growth, vol. 158, 84 (1996).

* cited by examiner

PROCESS FOR FABRICATING DEVICE COMPRISING LEAD ZIRCONATE TITANATE

CROSS-REFERENCE TO RELATED APPLICATION

This application claims priority of Provisional Application Ser. No. 60/096,581 which was filed Aug. 14, 1998.

BACKGROUND OF THE INVENTION

1. Field of the Invention

The invention relates to devices comprising lead zirconate titanate (PZT).

2. Discussion of the Related Art

There is a global interest in developing surface acoustic wave (SAW) devices of high frequency capability, high power durability, and near-zero temperature dependence of frequency, for a variety of applications, including filters, resonators, and delay lines for paging and wireless telephones, mobile switching systems, and global positioning systems. (See, e.g., K. Higaki et al., *IEEE MTT-S Digest*, Vol. 6, 829 (1997); S. Shikata et al., *Diamond and Related Materials*, Vol. 2, 1197 (1993); Y. Shibata et al., *Jpn. J. Appl. Phys.*, Vol. 32, L745 (1993); and T. Shiosaki et al., *IEEE Transactions on Ultrasonics, Ferroelectrics, and Frequency Control*, Vol. UFFC-33, No. 3, May 1986, the disclosures of which are hereby incorporated by reference.) A typical SAW device contains a piezoelectric material layer having an interdigital transducer (IDT) formed thereon. The operation frequency, $f$, of a SAW device, is dictated by a simple relation: $f=v/\lambda$, where, $v$ is SAW velocity in the material and $\lambda$ is wavelength (as determined by the line and space size of the fingers of the IDT). A gain in the frequency is achieved by increasing the SAW velocity and/or decreasing the line and space size of IDTs.

Because reduction in line and space size is limited by the capabilities of photolithography, some efforts have focused on finding materials that have increased SAW velocity. Diamond has the highest known acoustic wave velocity, and use of a diamond substrate with a piezoelectric material deposited thereon provides an opportunity to improve the velocity characteristics of SAW devices for high frequency uses. Investigation of piezoelectric materials for use in diamond-based SAW devices has focused largely on AlN and ZnO. While these candidate piezoelectric materials possess low elastic wave attenuation and offer high filtering accuracy relative to some ferroelectric candidates, they tend to have relatively poor piezoelectric properties (i.e., piezoelectric coefficients less than $12\times10^{-12}$ m/V). They also exhibit relatively weak electromechanical coupling, which limits filter bandwidth. In addition, because dipoles in these materials are not capable of being reoriented, the materials must be used in either single crystal or highly textured form. This structural requirement makes thin film growth on substrates such as diamond difficult.

One alternative material that has more recently attracted attention is ferroelectric lead zirconate titanate—$Pb(Zr_xTi_{1-x})O_3$ (PZT). (See, e.g., A. S. Nickles et al., *Integrated Ferroelectrics*, Vol. 10, 89 (1995); B. Jaber et al., *Sensors and Actuators A*, Vol. 63, 91 (1997); and R. Dat et al., *Integrated Ferroelectrics*, Vol. 9, 309 (1995).) PZT offers several improvements over previously considered piezoelectric materials. For example, the piezoelectric and electromechanical coupling coefficients of PZT are one order of magnitude higher than those of ZnO. Moreover, easier dipole reorientation under an external field and high remanent polarization allow the use of PZT in forms other than single crystal or highly textured.

Unfortunately, PZT exhibits the desired ferroelectric properties only in its perovskite phase, which is difficult to form on a substrate. This difficulty is generally attributed to a lower nucleation barrier for formation of the non-ferroelectric, non-piezoelectric, metastable pyrochlore phase PZT. Thus, PZT forms in its pyrochlore phase much more readily than its perovskite phase. Moreover, the pyrochlore PZT is not readily transformable to perovskite PZT by methods such as a high-temperature anneal. In evaluating this problem, the use of a lead titanate (PT) seeding layer was reported to ease the nucleation of perovskite PZT on a particular substrate—sapphire, when using sol-gel deposition for both the PT and PZT. (See C. K. Kwok and S. B. Desu, *J. Mater. Res.*, Vol. 8, 339 (1993).) Sol-gel deposition, however, is more of a laboratory technique than a feasible commercial fabrication process. For example, the processing sequence of sol-gel thin films is somewhat incompatible with typical device fabrication technology, and the relatively high potential for contamination also weighs against commercial use of sol-gel. In addition, the sol-gel technique does not provide an oriented structure. MgO buffer layers were similarly found to facilitate deposition of perovskite PZT on GaAs and Si substrates. (See A. Masuda et al., *J. Crystal Growth*, Vol. 158, 84 (1996).).

Methods for forming PZT in its perovskite form, advantageously in an oriented structure, on a variety of substrates, including diamond, are desired.

SUMMARY OF THE INVENTION

The invention provides a device comprising an oriented, perovskite PZT layer on substrates such as diamond, silicon, and platinum-coated materials. (Perovskite PZT indicates at least 98 vol. % of the layer is perovskite, as determined by x-ray diffraction. Oriented indicates that the layer exhibits a favored crystalline axis normal to the plane of the layer.) According to the invention, vapor phase techniques, e.g., physical or chemical vapor phase deposition processes, are used to deposit a PZT layer onto a relatively thin template layer located on a substrate. The template layer is more readily formed in a perovskite structure, compared to PZT, and exhibits a lattice spacing similar to perovskite PZT. Upon deposition of PZT, the perovskite template layer thereby promotes nucleation and growth of the PZT in a similarly perovskite form. Useful template layers include lead titanate, strontium titanate, and barium titanate. The vapor phase promotes formation of the oriented layer, such orientation providing enhanced piezoelectric properties. Vapor phase techniques also provide substantial control over composition, thickness, and uniformity, and are readily incorporated into a device fabrication process.

In one embodiment, a diamond substrate is used, advantageously with a lead titanate (PT) template layer. Conventionally, those in the art believed that diamond would oxidize at the high temperatures used for vapor phase deposition of piezoelectric materials such as PZT. Thus, alternative substrate materials, which offered inferior properties, were used. Or alternative fabrication techniques, e.g., low temperature techniques, which did not provide an oriented piezoelectric layer and/or which did not provide adequate growth of the piezoelectric layer, were used. The invention reflects the discovery, therefore, that it is possible to form an oriented, perovskite PZT layer on a diamond substrate, where the PZT layer exhibits a desirable piezoelectric coefficient, e.g., ranging from about $50\times10^{-12}$ to about $350\times10^{-12}$ m/V. Such a structure provides useful properties for a variety of devices, including SAW applications.

DETAILED DESCRIPTION OF THE INVENTION

Figure 1A:
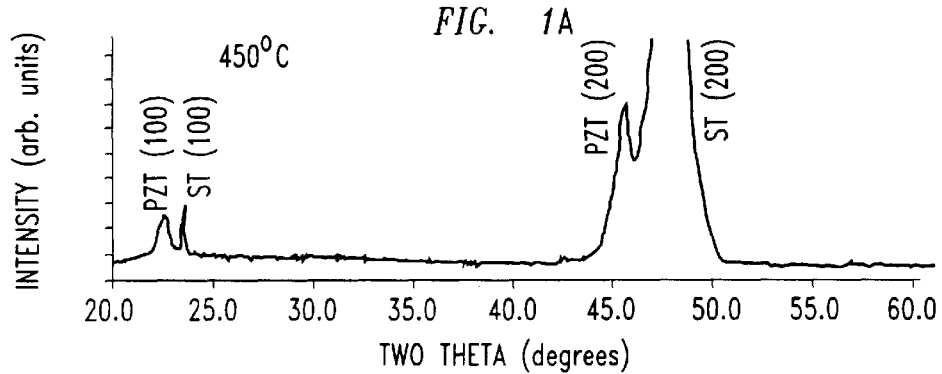
FIGS. 1A, 1B, 1C and 1B show x-ray diffraction patterns of PZT layers deposited by pulsed laser deposition on $SrTiO_3$ in 200 mTorr $O_2$ at a laser fluence per pulse of 2 $J/cm^2$ at temperatures of 450° C., 500° C., 600° C., and 700° C., respectively.
Figure 1B:
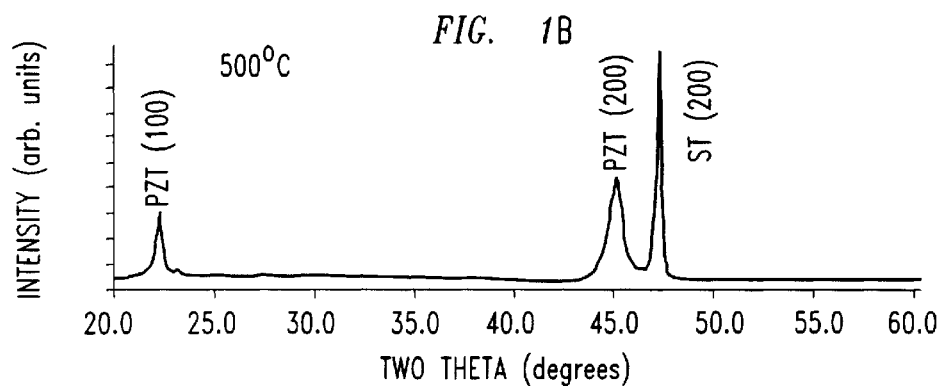
Figure 1C:
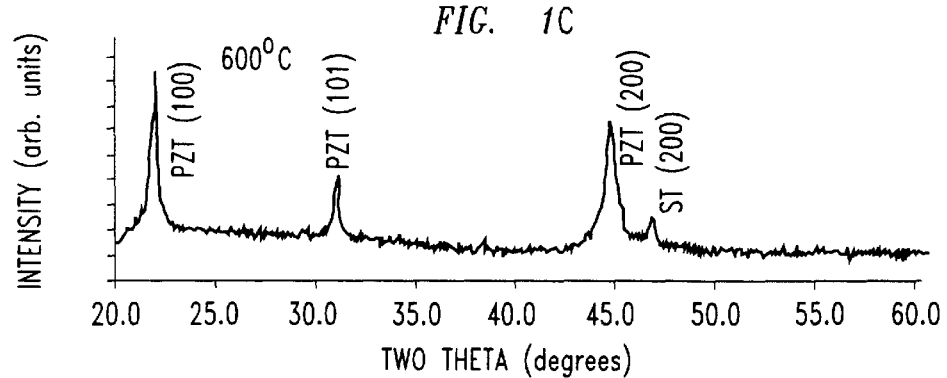
Figure 1D:
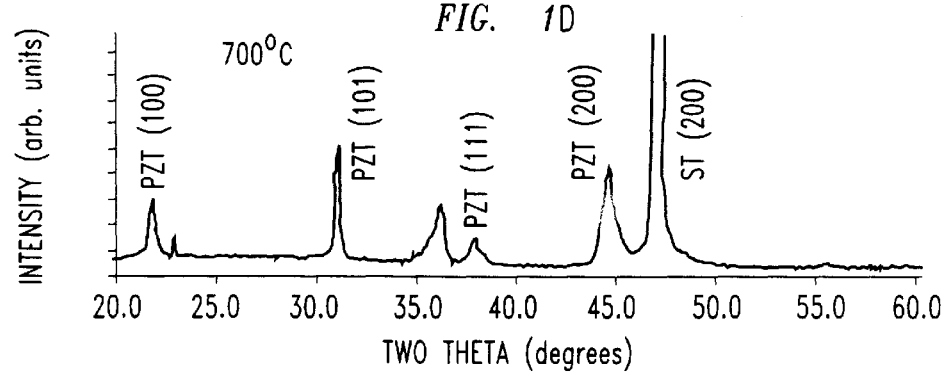

According to the invention, perovskite PZT layers are capable of being formed on a variety of substrates, including diamond, silicon, and Pt-coated materials. As discussed above, diamond has a high acoustic wave velocity. A diamond substrate thus allows larger IDT line and space size and improves device manufacturability and reliability at a given frequency. Silicon substrates are useful for the contemplated integration of ferroelectric materials with silicon technology. And platinum is a common electrode material.

A perovskite template layer is deposited on the substrate (perovskite layer indicates the layer is at least 98 vol. % perovskite as determined by x-ray diffraction). The thickness of the template layer varies depending on the particular template material, the formation process, and the desired use of the structure.

Typical thicknesses for a lead titanate template layer range from about 0.06 to about 0.12 µm. The template layer is selected to exhibit a simple perovskite structure having similar lattice spacing to perovskite PZT. The template layer should also be more amenable to formation in perovskite phase, compared to PZT. Examples include lead titanate, strontium titanate, and barium titanate. The template layer is capable of being deposited on the substrate by any suitable process, but it is advantageous to deposit the template layer by a vapor deposition process, for the reasons presented herein.

The subsequently deposited PZT layer is typically about 0.1 to about 10 µm thick, depending on the particular application, is of perovskite form (i.e., at least 98 vol. % perovskite according to x-ray diffraction), and is an oriented layer (i.e., exhibits a favored crystallographic axis normal to the plane of the layer). (For SAW applications using a diamond substrate, the thickness of the PZT layer is generally about 0.1 to about 5 µm) The PZT layer is deposited by a vapor phase deposition technique. Possible techniques include a variety of physical and chemical vapor phase deposition techniques, such as, but not limited to, chemical vapor deposition, plasma-enhanced chemical vapor deposition, metalorganic chemical vapor deposition, pulsed laser deposition, sputtering, electron beam evaporation. The vapor phase deposition contributes to the desired orientation of the perovskite PZT layer, such orientation providing enhanced piezoelectric properties. Vapor phase techniques also provide substantial control over composition, thickness, and uniformity, and are readily incorporated into a device fabrication process. Thus, it is advantageous to deposit both the template layer and the PZT layer by such vapor phase techniques. The discussion below focuses on pulsed laser deposition (PLD), using a template layer of lead titanate (PT), but the guidelines presented are applicable to other vapor phase techniques and template materials as well.

In one embodiment, a PT template layer and a PZT layer are formed by PLD. PLD offers several advantages, including its ability to allow congruent composition transfer from target to substrate. This characteristic is significant in the deposition of multi-component compounds composed of elements of vastly different volatility and sputter yield, as is the case with PZT. PLD's tolerance of high deposition pressure also makes phase and composition of a complex system more controllable in a reactive environment.

The difficulty encountered in the nucleation and formation of a perovskite PZT layer is attributed to the lower nucleation barrier to the formation of the intermediate and metastable pyrochlore PZT phase, which has an oxygen-deficient fluorite structure and exhibits no ferroelectric or piezoelectric properties. Thus, PZT will tend to form in its pyrochlore phase. Once formed, pyrochlore PZT is not readily transformed to perovskite PZT by high-temperature annealing. The formation of pyrochlore PZT is widely reported during both bulk and thin film processing, and pyrochlore PZT appears to be the predominant phase in PZT layers deposited by PLD directly on diamond, Si, and Pt-coated substrates at temperatures above 600° C., as reflected in Example 2. As further reflected in Example 2, deposition of PZT directly onto these substrates, by PLD, at 500° C. tends to yield only amorphous PZT. The activation energy for nucleation of perovskite PZT is reported to be 441 kJ/mol, compared to 112 kJ/mol for its growth. Deposition of perovskite PZT therefore appears to be limited by nucleation rather than growth.

Formation of perovskite PZT can be described as a partial substitution of $Ti^{4+}$(r=0.61 A) cations in PT with $Zr^{4+}$(r=0.72 A) cations, which occupy the octahedral interstitial sites surrounded by $O^{2-}$ anions. The 18% difference in ionic radii between smaller $Ti^{4+}$ and larger $Zr^{4+}$ represents a significant excess strain energy in PZT compared with PT and thus creates the high nucleation energy barrier. While PT, and other template layer materials, are capable of exhibiting a pyrochlore phase, it is much easier to nucleate such template materials in perovskite form, compared to formation of perovskite PZT. As for PT, perovskite PT growth does not appear to be substrate-selective, although some correlation appears to exist between the preferred growth orientation and the substrate type. (Also, PLD of PT does not always reproduce the same preferred orientation for the same type of substrate.) The PT structure, however, as reflected in Example 2 and FIG. 2C, tends to be (111) textured on Pt-coated substrates where Pt has a (111) preferred orientation. This correlation is believed to be due to small lattice mismatch between PT (a=3.961) and Pt (a=3.923). From an applications standpoint, it is possible that a growth texture with a (001) preferred orientation will be desired for improved piezoelectric characteristics.

As discussed previously, the high nucleation energy barrier of perovskite PZT must be overcome to form a substantially perovskite PZT layer. This is achieved in the invention by the formation of a perovskite template layer that offers good match in lattice and structure. The ready formation of a simple perovskite layer from materials such as lead titanate, strontium titanate, and barium titanate by vapor deposition, including pulsed laser deposition, along with good lattice matching to perovskite PZT, makes these materials attractive as template layers. And PZT is readily deposited onto such materials. PT is a particularly useful template layer. Such template materials are typically ferroelectric, but tend to be of less value than PZT for practical applications, due to less robust piezoelectric properties and the need for high field and high temperature for dipole realignment, relative to PZT.

To control the composition of the template layer and PZT layers, vapor deposition is performed under relatively strict processing parameters, particularly when competitive phase types and elements of vastly different volatility are present, as in the case of PZT and PT. For example, there is an interrelationship between temperature, oxygen pressure, composition, and phase during PLD deposition of PZT. Lead is highly volatile, and as reflected in Example 4, and Table 1, at low oxygen pressure, lead arriving on a substrate is able to quickly re-evaporate. As oxygen pressure increases, the sticking coefficient and thus retention of lead is moderated by oxygen via Pb—O bond formation. Too high an oxygen pressure in the chamber, however, increases scattering and nucleation in the gas phase and thus reduces the deposition rate.

The composition of PZT layers is also temperature-dependent, as reflected in Example 5, and Table 2, for layers deposited at 2 J/cm$^2$ in 200 mTorr oxygen. The relatively high Zr/Pb and Ti/Pb ratios in the layer deposited at 600° C., compared with the PZT target, are indicative of a lead deficiency. The pressure and temperature dependence appears to result from a relationship between evaporation of lead and its retention via Pb and O interactions.

Figure 4:
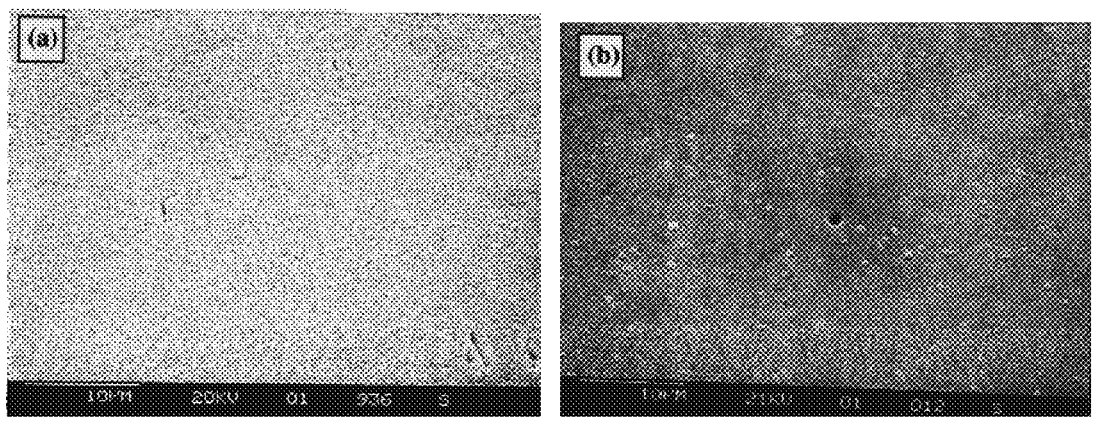
FIGS. 4A and 4B are scanning electron micrographs of PZT layers deposited on lead titanate on a diamond substrate by pulsed laser deposition in 200 mTorr $O_2$ at 650° C., and at 1 $J/cm^2$ and 2 $J/cm^2$, respectively.

There is also a correlation between laser fluence and the deposition rate and morphology of the PZT layers. As reflected in Example 6, at 650° C. in 200 mTorr O$_2$, which is suitable for PZT deposition from phase and composition viewpoints, deposition at 2 J/cm$^2$ yields a rate of 24 nm/min. Deposition at 1 J/cm$^2$ reduces the rate to 12 nm/min. The linear dependence of the deposition rate on laser fluence is anticipated above the ablation threshold. SEM micrographs of PZT layers on diamond with a PT template layer, according to Example 6, where PZT was deposited by PLD at 1 and 2 J/cm$^2$, are shown in FIGS. 4A and 4B, respectively. The reduction in particulate density in the layer as the laser fluence is decreased is clear. The pore in the layer at 2 J/cm$^2$ in FIG. 4A is apparently due to dislodgment of a micron-sized particle either during or after deposition. The correspondence between laser fluence and particulate density is also illustrated by the scanning electron micrographs of FIGS. 5A and 5B, which show PZT layers on Pt—Si formed according to Example 7, at 1 and 2 J/cm$^2$, respectively. The layer deposited at 1 J/Cm$^2$ has an estimated particulate size of 0.6–0.7 $\mu$m and a particulate density of 0.4×10$^8$/cm$^2$. In contrast, the layer deposited at 2 J/cm$^2$ has an estimated particulate size of 0.4–0.5 $\mu$m and a particulate density of 2.4×10$^8$/cm$^2$. Particulates appear to be of the same phase as the perovskite PZT target. Once deposited on a substrate or a growing pyrochlore PZT layer, these particulates act as seeds for perovskite PZT growth.

Such particulate formation is intrinsic to the PLD process. It is possible, however, for particulates to become a source of pores or pinholes in the layers due to their detachment or shadowing effect, and the particulate concentration should be kept as low as possible. Low laser fluence is beneficial for such particulate reduction. However, deposition at laser fluences less than 1 J/cm$^2$ tend to yield PZT layers of mixed perovskite and pyrochlore phases.

The PZT layers deposited, with a perovskite PT template layer, on diamond and other substrates exhibit respectable piezoelectric and acoustic properties, as reflected in Examples 8 and 9. Advantageously, the PZT layers of the invention exhibit a piezoelectric coefficient ranging from about 50×10$^{-12}$ to about 350×10$^{-12}$ m/V, and a dielectric constant ranging from about 500 to about 650 at 1 V and 100 kHz (both parameters measured as described in Example 8). These characteristics make the PZT structures of the invention suitable for a variety of SAW device applications. In addition, the PT/PZT perovskite layers are useful in other devices, such as nonvolatile memories, microelectromechanical devices, and sensors and actuators. Device applications are discussed generally in *MRS Bulletin*, Part II—Device Applications, Vol. 21, No. 7 (1996)

The invention will be further clarified by the following examples, which are intended to be exemplary.

Experimental Conditions

A pulsed KrF excimer laser (248 nm, 25 ns pulse width) operating at a repetition rate of 10 Hz was used to ablate commercial Pb(Zr$_{0.53}$Ti$_{0.47}$)O$_3$ (PZT) and PbTiO$_3$ (PT) targets. The targets were mounted on a triple-shaft carousel designed to ablate any of three rotating targets (~5 rpm). This feature permits in-situ template layer growth or multi-layer deposition. The morphotropic composition of PZT was selected to provide desirable piezoelectric properties in the PbZrO$_3$—PbTiO$_3$ solution system. Substrates included diamond, (100) oriented SrTiO$_3$ and (100) oriented Si. (Orientation indicates that the wafers are oriented with the (---) plane parallel to the surface of the substrate.) Diamond and Si with sputter-deposited Pt electrode layers (about 100 nm thick) were also used. In the case of Pt-coated Si, a silicon oxide layer (about 200 to about 400 nm thick) was present to prevent Pt and Si reactions at elevated temperatures. The target to substrate distance was maintained at 5 cm. Major processing parameters explored were substrate temperature (450°–700° C.), chamber oxygen pressure (20–1000 mTorr), and laser fluence (⅓–2 J/cm$^2$ per pulse).

The phases present and the crystal orientation in the layers deposited were characterized using x-ray diffraction (XRD). The morphology and composition of the layers were studied using scanning electron microscopy (SEM) in conjunction with energy dispersive X-ray (EDX) analysis. Complementary composition analysis was performed by X-ray photo-electron spectroscopy (XPS). The dielectric constants of the layers were derived from capacitance measurements. The piezoelectric coefficients were determined using laser interferometry. The acoustic velocity and attenuation in the layers were ascertained using picosecond laser ultrasonic measurement.

EXAMPLE 1

XRD patterns from approximately 1 μm thick PZT layers deposited on approximately 0.3 mm thick $SrTiO_3$ substrates in 200 mTorr $O_2$ at 2 $J/cm^2$ at 450° C., 500° C., 600° C., and 700° C. are depicted in FIGS. 1A, 1B, 1C, and 1D, respectively. A small mismatch (~3%) in the lattice parameters between the PZT layer (a=4.036) and the substrate (a=3.905) made epitaxial growth of perovskite PZT possible at the lower end of the temperature range as shown in the Figure (by the presence of the (200) orientation). Higher temperature deposition accelerated random growth of perovskite. (All the PZT crystallographic orientations shown in FIGS. 1A–1D indicate perovskite PZT.) The diffraction pattern from the layer at 700° C. resembles the powder diffraction pattern of PZT. These results suggest processing parameters that provide appropriate conditions for perovskite PZT growth.

EXAMPLE 2

Figure 2A:
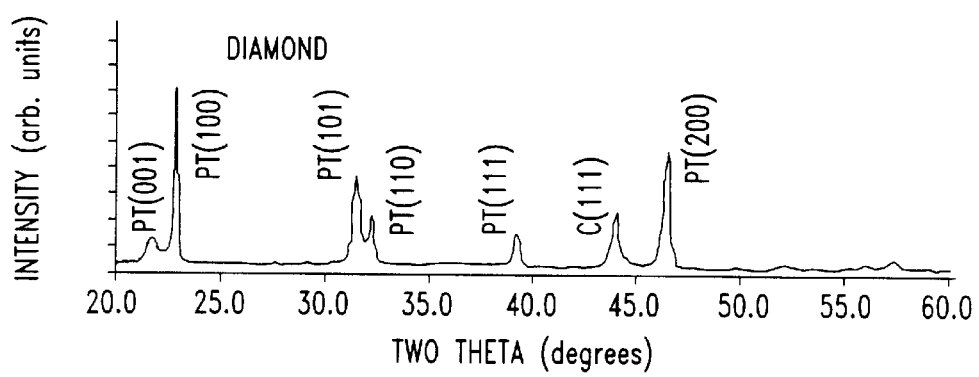
FIGS. 2A, 2B and 2C show x-ray diffraction patterns of lead titanate layers deposited on diamond, Si, and Pt-coated Si, respectively, by pulsed laser deposition in 200 mTorr $O_2$ at 2 $J/cm^2$ and 650° C.
Figure 2B:
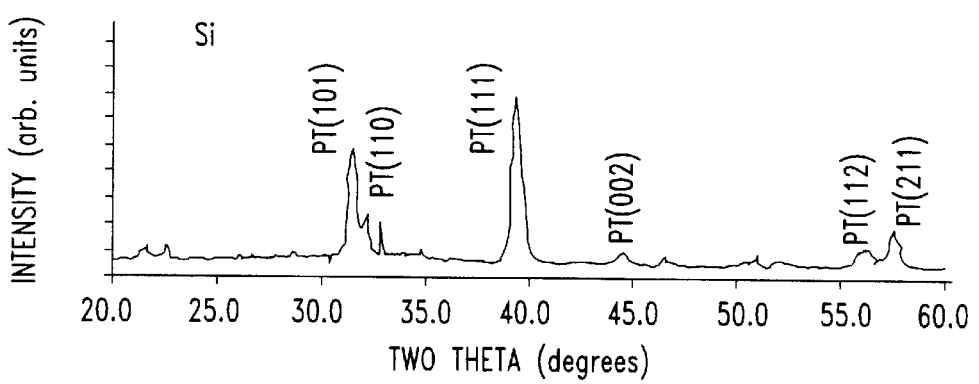
Figure 2C:
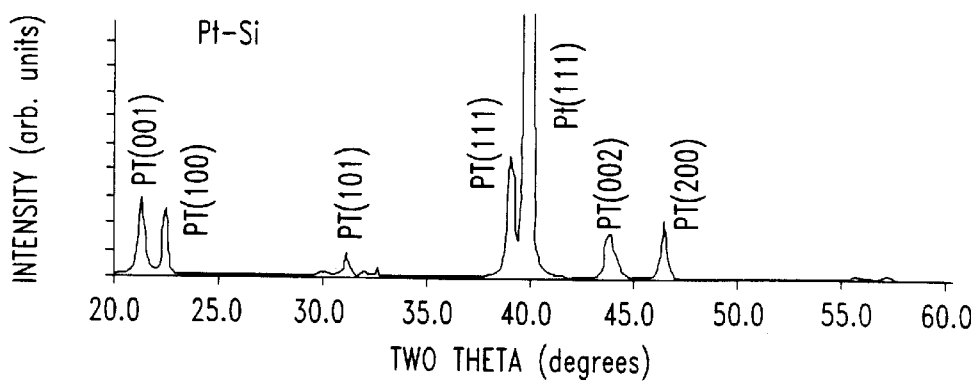

XRD spectra from approximately 1 μm thick PT layers deposited by PLD in 200 mTorr O2 at 2 $J/cm^2$ at 650° C. on approximately 0.3 mm thick diamond, approximately 0.2 mm thick Si, and approximately 0.1 μm Pt-coated Si substrates are illustrated in FIGS. 2A, 2B, and 2C, respectively. (All the crystallographic orientations shown in FIG. 2 indicate a perovskite structure.)

By contrast, deposition of approximately 1 gm thick PZT directly onto these substrates by PLD under the same oxygen pressure and fluence at 500° C., yielded primarily amorphous PZT.

EXAMPLE 3

Figure 3A:
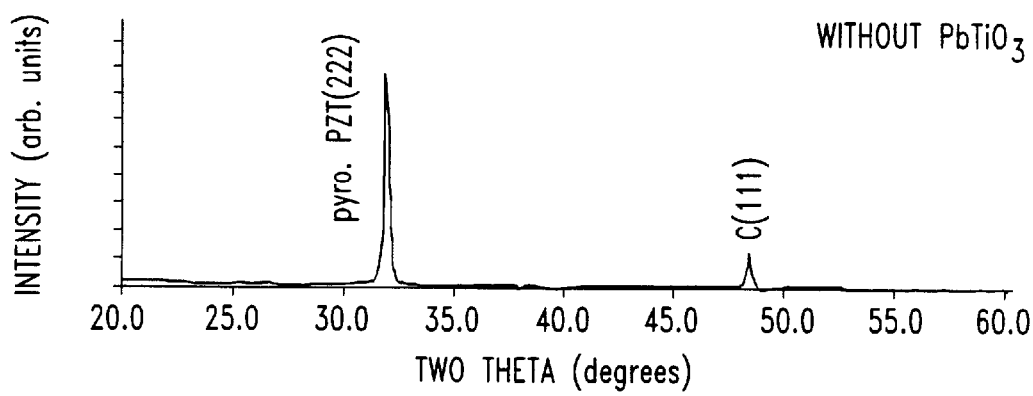
FIGS. 3A and 3B show x-ray diffraction patterns of PZT layers deposited without and with, respectively, a template PT layer, by pulsed laser deposition on diamond in 200 mTorr O2 at 2 $J/cm^2$ and 650° C.
Figure 3B:
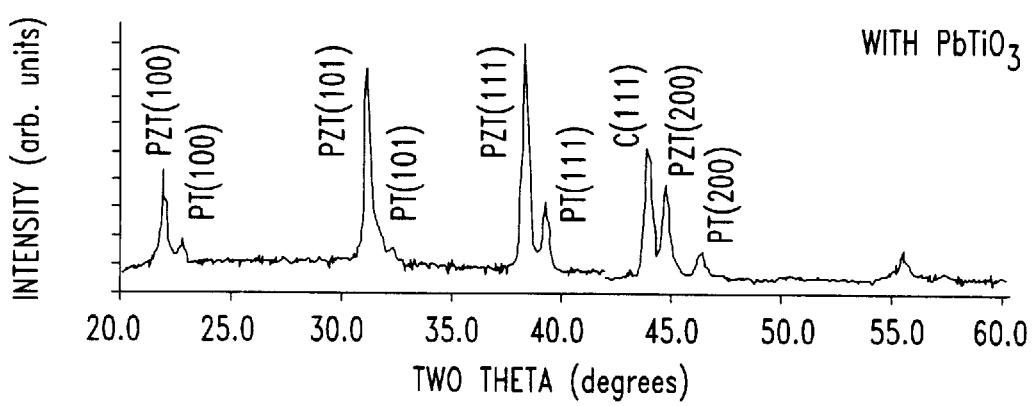

Shown in FIGS. 3A and 3B are XRD spectra from approximately 1 μm thick PZT layers deposited on approximately 0.3 mm thick diamond without (FIG. 3A) and with (FIG. 3B) an approximately 0.06 μm thick PT template layer. The layers were deposited by PLD in 200 mTorr $O_2$ at 2 $J/cm^2$ at 650° C. The structure was obtained by sequential deposition: PT for 5 minutes followed by PZT for 30 minutes. The two spectra of FIGS. 3A and 3B show that the PT/PZT layers are completely perovskite whereas the single PZT layer on diamond is entirely pyrochlore (as indicated by the (222) orientation).

EXAMPLE 4

The oxygen pressure dependence for approximately 1 μm thick PZT layers on approximately 0.3 mm thick diamond with an approximately 0.06 μm thick PT template layer is reflected in Table 1, with a comparison to the PZT target (shown by the integrated EDX intensity normalized to lead). The deposition was performed at 2 $J/cm^2$ at 650° C.

TABLE 1

Normalized integrated EDX intensity for PZT/PT layers on diamond with oxygen pressure as a parameter (T = 650° C).

|  | $I_{Pb}/I_{Pb}$ | $I_{Zr}/I_{Pb}$ | $I_{Ti}/I_{Pb}$ | $I_O/I_{Pb}$ |
|---|---|---|---|---|
| 20 mTorr | 1.00 | 1.25 | 0.66 | 0.19 |
| 100 mTorr | 1.00 | 0.55 | 0.27 | 0.09 |
| 200 mTorr | 1.00 | 0.48 | 0.27 | 0.09 |
| PZT target | 1.00 | 0.47 | 0.26 | 0.08 |

According to Table 1, deposition at 20 mTorr resulted in a significant lead deficiency in the PZT layer. The layer was pyrochlore in nature based upon XRD analysis.

EXAMPLE 5

The composition of PZT layers is also temperature-dependent, as reflected in Table 2 for approximately 1 μm layers deposited at 2 $J/cm^2$ in 200 mTorr oxygen (shown by the integrated EDX intensity normalized to lead). The relatively high Zr/Pb and Ti/Pb ratios in the layer deposited at 600° C., compared with the PZT target, are indicative of a lead deficiency. The pressure and temperature dependence appears to result from a relationship between evaporation of lead and its retention via Pb and O interactions. No apparent dependence was observed between composition and laser fluence in the 1–2 $J/cm^2$ range since this range is above the reported ablation threshold of 0.5–1 $J/cm^2$ for PZT.

TABLE 2

Normalized integrated EDX intensity for PZT/PT layers on diamond with temperature as a parameter (P($O_2$) = 200 mTorr).

|  | $I_{Pb}/I_{Pb}$ | $I_{Zr}/I_{Pb}$ | $I_{Ti}/I_{Pb}$ | $I_O/I_{Pb}$ |
|---|---|---|---|---|
| 600° C. | 1.00 | 0.64 | 0.30 | 0.09 |
| 650° C. | 1.00 | 0.48 | 0.27 | 0.09 |
| 700° C. | 1.00 | 0.45 | 0.26 | 0.08 |
| PZT target | 1.00 | 0.47 | 0.26 | 0.08 |

EXAMPLE 6

The relationship of deposition rate to laser fluence was examined. At 650° C. in 200 mTorr $O_2$, deposition at 2 $J/cm^2$ yielded a rate of 24 nm/min, while deposition at 1 $J/cm^2$ reduced the rate to 12 nm/min. The linear dependence of the deposition rate on laser fluence is anticipated above the ablation threshold. SEM micrographs of approximately 1 μm thick PZT layers on approximately 0.3 mm thick diamond with approximately 0.06 μm thick PT as a template deposited at 650° C. in 200 mTorr $O_2$ at 1 and 2 $J/cm^2$ are shown in FIGS. 4A and 4B, respectively. The reduction in particulate density in the layer as the laser fluence is decreased is clear. (The pore in the layer at 2 $J/cm^2$ in FIG. 4B is apparently due to dislodgment of a micron-sized particle either during or after deposition.)

EXAMPLE 7

Figure 5:
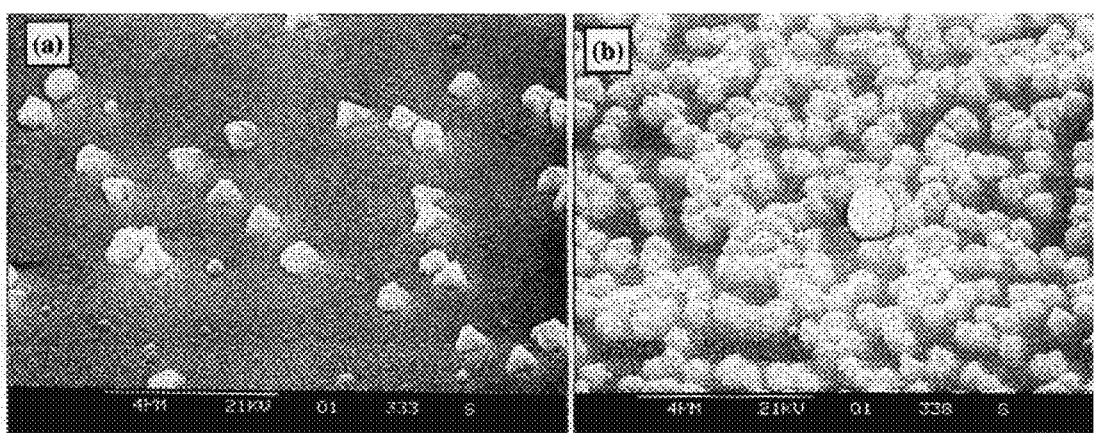
FIGS. 5A and 5B are scanning electron micrographs of PZT layers deposited on a Pt-coated Si substrate (without lead titanate) by pulsed laser deposition in 200 mTorr $O_2$ and at 650° C., at 1 $J/cm^2$ and 2 $J/cm^2$, respectively.

The correspondence between laser fluence and particulate density for approximately 1 μm thick PZT layers deposited on approximately 0.1 μm thick Pt on Si at 650° C. in 200 mTorr $O_2$, at 1 and 2 $J/cm^2$, is shown in FIGS. 5A and 5B, respectively. The layer deposited at 1 $J/Cm^2$ had an estimated particulate size of 0.6–0.7 μm and a particulate density of $0.4 \times 10^8/cm^2$. In contrast, the layer deposited at 2 $J/cm^2$ had an estimated particulate size of 0.4–0.5 μm and a particulate density of $2.4 \times 10^8/cm^2$. Without a PT template layer, the PZT layers were pyrochlore, as ascertained by XRD. Particulates, on the other hand, appear to be of the same phase as the perovskite PZT target.

EXAMPLE 8

Figure 6:
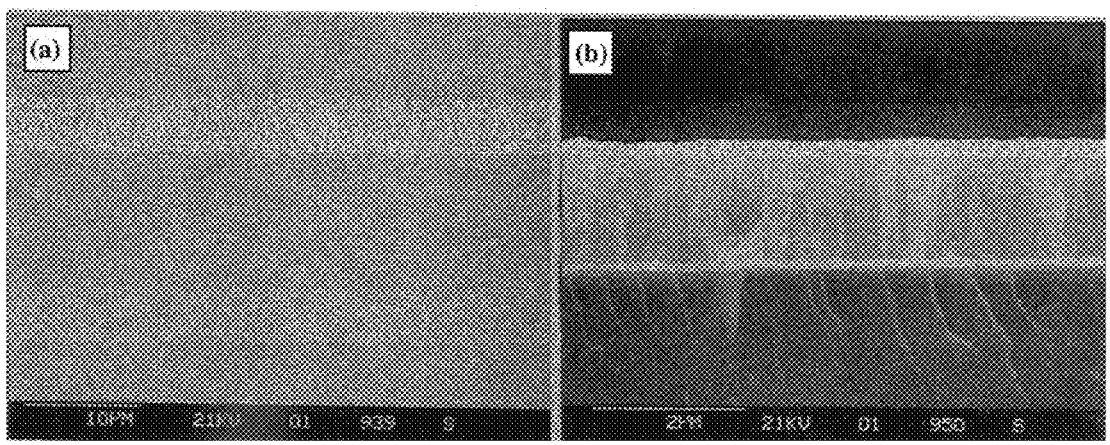
FIGS. 6A and 6B are scanning electron micrographs of the surface and cross section, respectively, of a PZT layer deposited on a lead titanate template layer on a diamond substrate by pulsed laser deposition in 200 mTorr $O_2$ at 650° C. and 1 $J/cm^2$.

Perovskite PZT layers for dielectric, piezoelectric, and acoustic measurements were deposited at 650° C., in 200 mTorr $O_2$, and at 1 $J/cm^2$ laser fluence. This combination of parameters provides advantageous processing conditions from the standpoint of phase and stoichiometry. The deposition time ranged from 60 to 120 minutes, yielding PZT layers in the thickness range of about 0.7 to about 1.4 μm. The time for deposition of PT template layers was typically 5 minutes, giving a PT thickness of about 60 nm. The SEM photographs of FIGS. 6A and 6B illustrate the surface morphology and a cleaved cross-section, respectively, of PZT and PT layers (a total PZT/PT thickness of about 1.5 μm) deposited on a [thickness] Pt-coated Si substrate using these parameters. Particulate formation during PLD was evidenced in the surface morphology. The growth texture of PZT is exhibited in the cross-sectional micrograph.

Dielectric and laser piezoelectric measurements using Al/PZT/PT/Pt—Si and/or Al/PZT/PT/Pt-diamond test geometry (~3.0 mm diameter Al dots) yielded properties comparable to those of bulk PZT materials. Specifically, the relative dielectric constants of the layers are 500–650 at 1 V and 100 kHz. Their piezoelectric coefficients, $d_{33}$, fall in the range of $50 \times 10^{-12}$ – $350 \times 10^{-12}$ m/V (~20% uncertainty in absolute value). The large variation in the $d_{33}$ value is attributed to microstructural inhomogeneity of the PZT layers. The piezoelectric measurements were performed at 0.1–1 V on ~1 μm thick PZT layers. The corresponding field of 1–10 kV/cm is lower than the 100 kV/cm poling field required to align dipoles in randomly oriented PZT thin layers at room temperature. The net polarization present in the as-deposited layers is significant from the point of view of device fabrication. This polarization attributable to the columnar microstructure developed during PZT growth, as revealed by cross-sectional SEM observation. A numerical simulation of SAW propagation in a layered PZT/Pt-Si structure yielded coupling coefficients, $k^2$, ranging from 8 to 13% at optimum layer thickness depending on the SAW mode. The $k^2$ value for ZnO is reported to be ~1.1%, in contrast.

EXAMPLE 9

Figure 7:
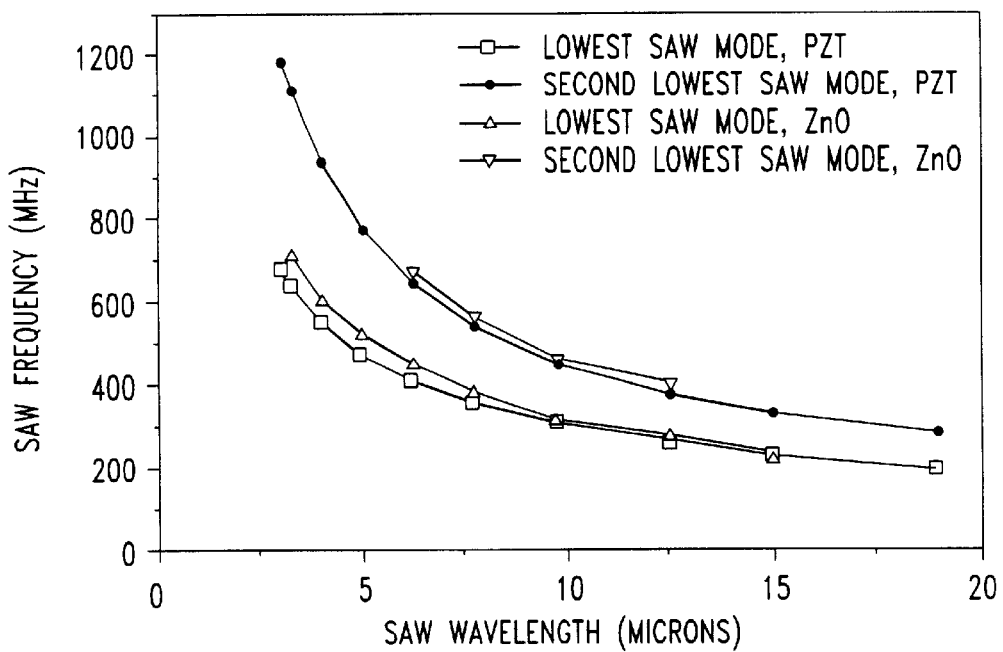
FIG. 7 shows SAW frequency as a function of wavelength for PZT/lead titanate and ZnO layers deposited on Pt-coated Si, at different SAW modes.
Figure 8:
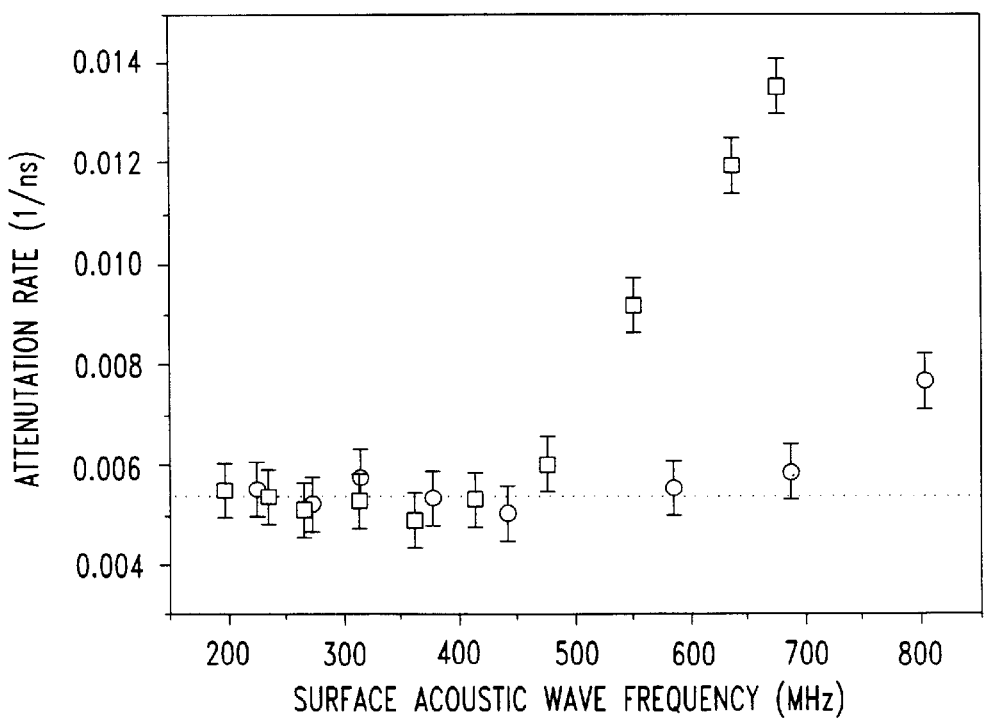
FIG. 8 shows acoustic damping rate as a function of SAW frequency for PZT/lead titanate and ZnO layers deposited on Pt-coated Si.

Laser acoustic measurements showed nearly overlapping frequency versus wavelength relations for PLD deposited PZT and sputter deposited ZnO layers on Pt-Si for different SAW modes. Shown in FIG. 7 are results obtained from PZT/PT(~1000 nm)/Pt(100 nm)/SiO$_2$(400 nm)/Si and ZnO (~1000 nm)/Pt(100 nm)/SiO$_2$(400 nm)/Si test structures. Error bars are of the size of the symbols in the Figure. These results indicate that SAW velocities in the two multilayer structures are similar. Their acoustic attenuation, however, differs. FIG. 8 shows acoustic attenuation as a function of SAW frequency in the PZT and ZnO structures. The acoustic attenuation in the PZT is approximately three times higher than that in the ZnO. This difference in attenuation for PZT and ZnO is expected to remain the same at higher frequencies (>1 GHz) given its expected parabolic dependence on frequency.

Other embodiments of the invention will be apparent to those skilled in the art from consideration of the specification and practice of the invention disclosed herein.

What is claimed is:

1. A process for fabricating a device, comprising the steps of:

providing a diamond substrate;

depositing an oriented perovskite template layer comprising lead titanate, strontium titanate, or barium titanate directly onto the substrate;

depositing a layer of lead zirconate titanate onto the template layer by a vapor phase deposition method, wherein the template layer induces oriented nucleation and growth of the lead zirconate titanate layer, such that the lead zirconate titanate layer is an oriented, perovskite layer exhibiting a piezoelectric coefficient of about $50 \times 10^{-12}$ to about $350 \times 10^{-12}$ m/V.

2. The process of claim 1, wherein the template layer is deposited by a vapor phase deposition method.

3. The process of claim 1, wherein the template layer is lead titanate and has a thickness of about 0.06 to about 0.12 μm.

4. The process of claim 1, wherein the lead zirconate titanate layer has a thickness of about 0.1 to about 5 μm.

5. The process of claim 1, wherein the vapor phase deposition method for the lead zirconate titanate layer is physical vapor deposition or chemical vapor deposition.

6. The process of claim 2, wherein the vapor phase deposition method for the template layer is physical vapor deposition or chemical vapor deposition.

7. The process of claim 1, wherein the dielectric constant of the lead titanate zirconate layer is about 500 to about 650 at 1 V and 100 kHz.

8. The process of claim 1, wherein the device is an acoustic resonator device.

* * * * *